US012628613B2

(12) United States Patent
Lee et al.

(10) Patent No.: US 12,628,613 B2
(45) Date of Patent: May 12, 2026

(54) TRANSPORT VEHICLE CLEANING DEVICE AND ARTICLE TRANSPORT EQUIPMENT INCLUDING THE SAME

(71) Applicant: SEMES CO., LTD., Cheonan-si (KR)

(72) Inventors: Sung Ho Lee, Asan-si (KR); Ok Kyung Kang, Suwon-si (KR); No Jae Park, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 605 days.

(21) Appl. No.: 17/990,726

(22) Filed: Nov. 20, 2022

(65) Prior Publication Data

US 2023/0178402 A1 Jun. 8, 2023

(30) Foreign Application Priority Data

Dec. 2, 2021 (KR) ........................ 10-2021-0170955

(51) Int. Cl.
| | |
|---|---|
| *H01L 21/677* | (2006.01) |
| *B08B 5/02* | (2006.01) |
| *H01L 21/67* | (2006.01) |

(52) U.S. Cl.
CPC ........ *H01L 21/67733* (2013.01); *B08B 5/023* (2013.01); *H01L 21/67051* (2013.01)

(58) Field of Classification Search
None
See application file for complete search history.

(56) References Cited

U.S. PATENT DOCUMENTS

2013/0291332 A1 11/2013 Nakao

FOREIGN PATENT DOCUMENTS

| CN | 103357614 | 10/2013 |
|---|---|---|
| CN | 203972208 | 12/2014 |
| KR | 10-2011-0139642 | 12/2011 |
| KR | 10-2020-0035639 | 4/2020 |

OTHER PUBLICATIONS

Google Patents translation of KR20110139642A (Year: 2025).*
Google Patents translation of KR20200035639A (Year: 2025).*
Office Action from the Korean Intellectual Property Office dated Apr. 5, 2023 9 pages, not in English.
Office Action from China National Intellectual Property Administration dated Nov. 15, 2025 12 pages.

* cited by examiner

*Primary Examiner* — Eric W Golightly

(57) ABSTRACT
A transport vehicle cleaning device that cleans a transport vehicle incudes a housing including a cleaning space accommodating the transport vehicle for cleaning, a plurality of fans disposed at an upper part of the housing and generating a downward airflow in the cleaning space, a cleaning gas injector disposed at a ceiling of the housing and injecting a cleaning gas towards the transport vehicle in the cleaning space of the housing, an exhaust unit provided at a lower part of the housing and exhausting the cleaning gas supplied to the cleaning space and a foreign matter removed from the transport vehicle from the cleaning space, and a frame cover disposed in the housing and configured to completely cover opposite openings of the frame in the housing to form a closed internal space of the frame separated from the cleaning space.

9 Claims, 9 Drawing Sheets

TRANSPORT VEHICLE CLEANING DEVICE AND ARTICLE TRANSPORT EQUIPMENT INCLUDING THE SAME

CROSS REFERENCE TO RELATED APPLICATION

The present application claims priority to Korean Patent Application No. 10-2021-0170955, filed Dec. 2, 2021, the entire contents of which is incorporated by reference herein for all purposes.

BACKGROUND OF THE INVENTION

1. Field of the Invention

The present invention relates to a cleaning device for a transport vehicle that transfers articles, and article transport equipment including the same.

2. Description of the Related Art

In a manufacturing process of a semiconductor device or a display device, materials such as semiconductor wafers, semiconductor strips, glass substrates, and display panels may be transported through unmanned transport systems such as overhead hoist transport (OHT) devices, rail guided vehicle (RGV) devices, automatic guided vehicle (AGV) devices. In particular, such transport devices may include a transport vehicle configured to be movable along driving rails installed on the ceiling or floor of a clean room.

For example, in a clean room for manufacturing semiconductor devices, driving rails for material transport may be installed in a ceiling area, and a plurality of transport vehicles may be arranged to be movably along the driving rails. The transport vehicle may include a driving module (such as a vehicle) configured to be movable along the driving rails, and a hoist module connected to the bottom of the driving module for transporting materials. The hoist module may include a hand unit including a frame providing an internal space and grippers for gripping the materials, and a hoist unit that moves the hand unit in a vertical direction. The hand unit and the hoist unit may be arranged in the internal space.

The transport vehicles may generate foreign matters such as particles by driving wheels or the like during the driving, and such foreign matters may adhere to the surface of the transport vehicle. In particular, the foreign matters may adhere to the inside or outside of the frame. If driving is performed with foreign matters adhering to the surface of the transport vehicle, the foreign matters may be scattered during the driving, and contaminate the manufacturing line.

SUMMARY OF THE PRESENT DISCLOSURE

Therefore, an object of the present invention is to provide a transport vehicle cleaning device and article transport equipment capable of preventing an occurrence of a situation in which foreign matters scattered from the upper part of the transport vehicle adhere to the lower part again.

Objects of the present disclosure are not limited to those described above, and other objects not mentioned will be clearly understood by those skilled in the art from the following description.

According to an embodiment of the present disclosure, a transport vehicle cleaning device that cleans a transport vehicle transporting an article along a driving rail and including a driving module and a frame connected to a lower part of the driving module and having a storage space for the article, incudes a housing wrapping the driving rail and a movement path of the transport vehicle and including a cleaning space accommodating the transport vehicle for cleaning, a plurality of fans disposed at an upper part of the housing and generating a downward airflow in the cleaning space, a cleaning gas injector disposed at a ceiling of the housing and injecting a cleaning gas towards the transport vehicle in the cleaning space of the housing, an exhaust unit provided at a lower part of the housing and exhausting the cleaning gas supplied to the cleaning space and a foreign matter removed from the transport vehicle from the cleaning space, and a frame cover disposed in the housing and configured to completely cover opposite openings of the frame in the housing to form a closed internal space of the frame separated from the cleaning space, thereby preventing particles scattered by the cleaning gas from the upper part of the transport vehicle from adhering to the lower part of the transport vehicle.

According to an embodiment of the present disclosure, there is provided a transport vehicle cleaning method for cleaning a transport vehicle configured to be movable along a driving rail for transporting an article. The transport vehicle cleaning method includes: supplying a downward airflow into a transport vehicle cleaning device that cleans the transport vehicle; entering the transport vehicle into the transport vehicle cleaning device; cleaning the transport vehicle; and exiting the transport vehicle to an outside of the transport vehicle cleaning device. The cleaning of the transport vehicle includes a process for protecting a frame provided at a lower part of the transport vehicle from particles.

According to an embodiment of the present invention, there is provided article transport equipment including: a driving rail that is provided on a ceiling and provides a transport path for transporting an article; at least one or more article transport vehicle including a driving module that drives along the driving rail, and a hoist module that is connected to a lower part of the driving module and provides a frame for storing the article; and a transport vehicle cleaning device that is disposed to be adjacent to the driving rail to perform cleaning of the article transport vehicle and is capable of preventing an occurrence of a situation in which particles scattered from the driving module adhere to the hoist module again.

The effects of the present invention are not limited to the effects described above, and effects not mentioned can be clearly understood by those skilled in the art, from the specification and the attached drawings.

BRIEF DESCRIPTION OF THE DRAWINGS

The above and other objectives, features, and other advantages of the present disclosure will be more clearly understood from the following detailed description taken in conjunction with the accompanying drawings, in which:

FIG. 1 is a conceptual diagram illustrating an overall configuration of article transport equipment according to an embodiment of the present disclosure;

FIGS. 4 and 5 are front and left side views illustrating a configuration of a transport vehicle cleaning device illustrated in FIG. 1;

DESCRIPTION OF THE EMBODIMENTS

Figure 2:
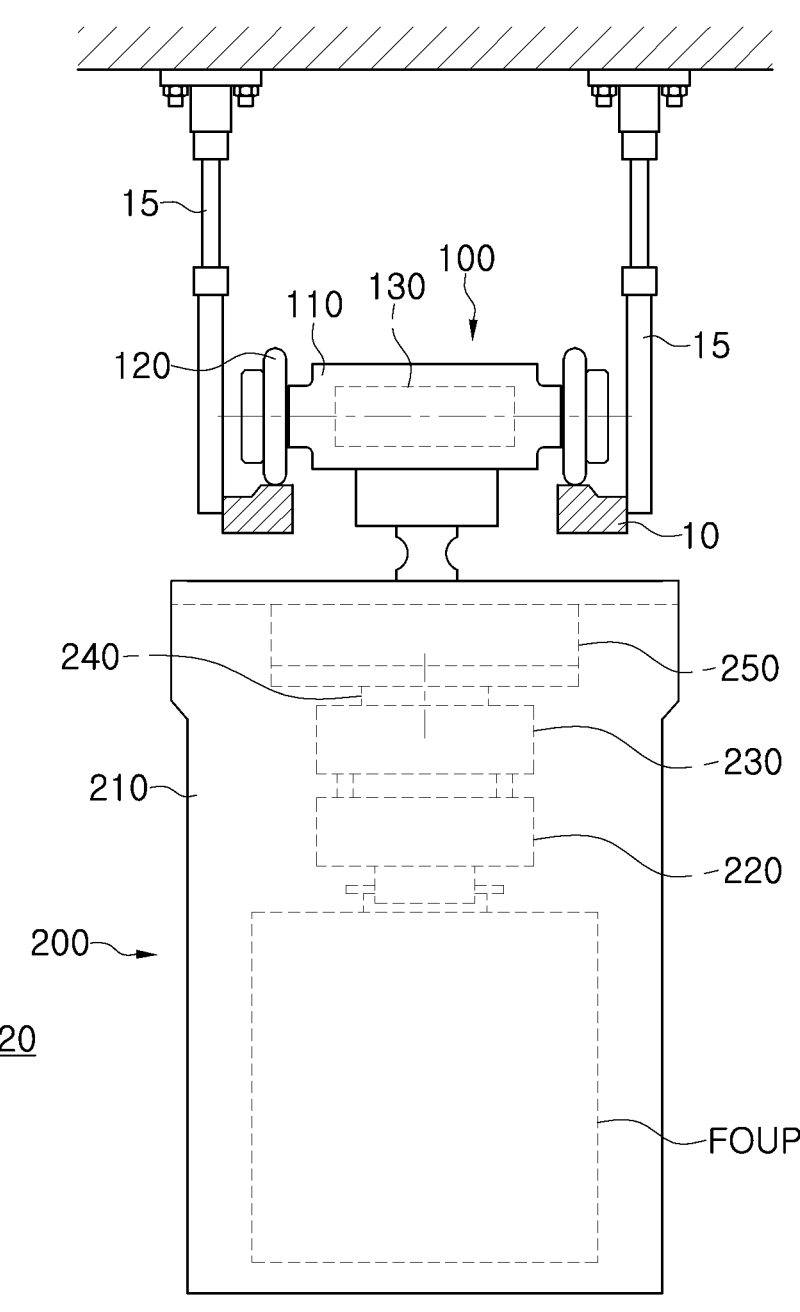
FIGS. 2 and 3 are front and left side views illustrating a configuration of an article transport vehicle illustrated in FIG. 1.

Hereinafter, embodiments of the present disclosure will be described in detail with reference to the accompanying drawings to be easily implemented by those skilled in the art. The present disclosure may be implemented in various different forms and is not limited to the embodiments described herein.

In describing the present disclosure, when it is decided that a detailed description of a known configuration or function related to the disclosure makes the gist of the disclosure unclear, the detailed description is omitted, and parts having similar functions and actions are denoted by the same reference signs in all drawings.

At least some of the terms used in the specification are defined in consideration of functions in the present disclosure, and thus may vary according to the user, the operator intention, the custom, and the like. Therefore, the terms should be interpreted based on the content throughout the specification. In addition, in the specification, a sentence that a component is included means that other components may be further included, rather than excluding other components, unless otherwise stated. In addition, a sentence that a portion is "connected (or coupled) to" another portion includes not only a case of "being directly connected (coupled)" but also a case of "being indirectly connected (coupled) with other portions interposed therebetween".

Meanwhile, the size, the shape, and the line thickness of a component in the drawing may be somewhat exaggerated for convenience of understanding.

The present invention can be used to transport articles from a certain position to a desired position in a plant for manufacturing a semiconductor or a flat panel display (FPD). For example, in the present invention, articles can be transported between semiconductor (or flat panel display) manufacturing facilities. At this time, the articles may include a substrate (wafer and the like). For example, the article may be a container in which substrates are stored. Furthermore, the container may be a sealed container capable of protecting stored substrates from the outside. The sealed container may be a front opening unified pod (FOUP).

The present invention can be used to transport articles in various technical fields. The embodiment of the present disclosure will be described focusing on transport of a front opening unified pod (referred to as a FOUP below) in which a wafer is stored in an internal space as an article in a semiconductor manufacturing plant, between semiconductor manufacturing facilities.

A semiconductor manufacturing plant may include at least one or more clean rooms, and semiconductor manufacturing facilities that perform semiconductor manufacturing processes may be installed in the clean rooms. Semiconductors can be completed by repeatedly performing semiconductor manufacturing processes on wafers. Wafers subjected to a process in a specific semiconductor manufacturing facility can be transported to a semiconductor manufacturing facility for the next process. At this time, the wafer can be transported by article transport equipment including an OHT while stored in the FOUP.

Figure 1:
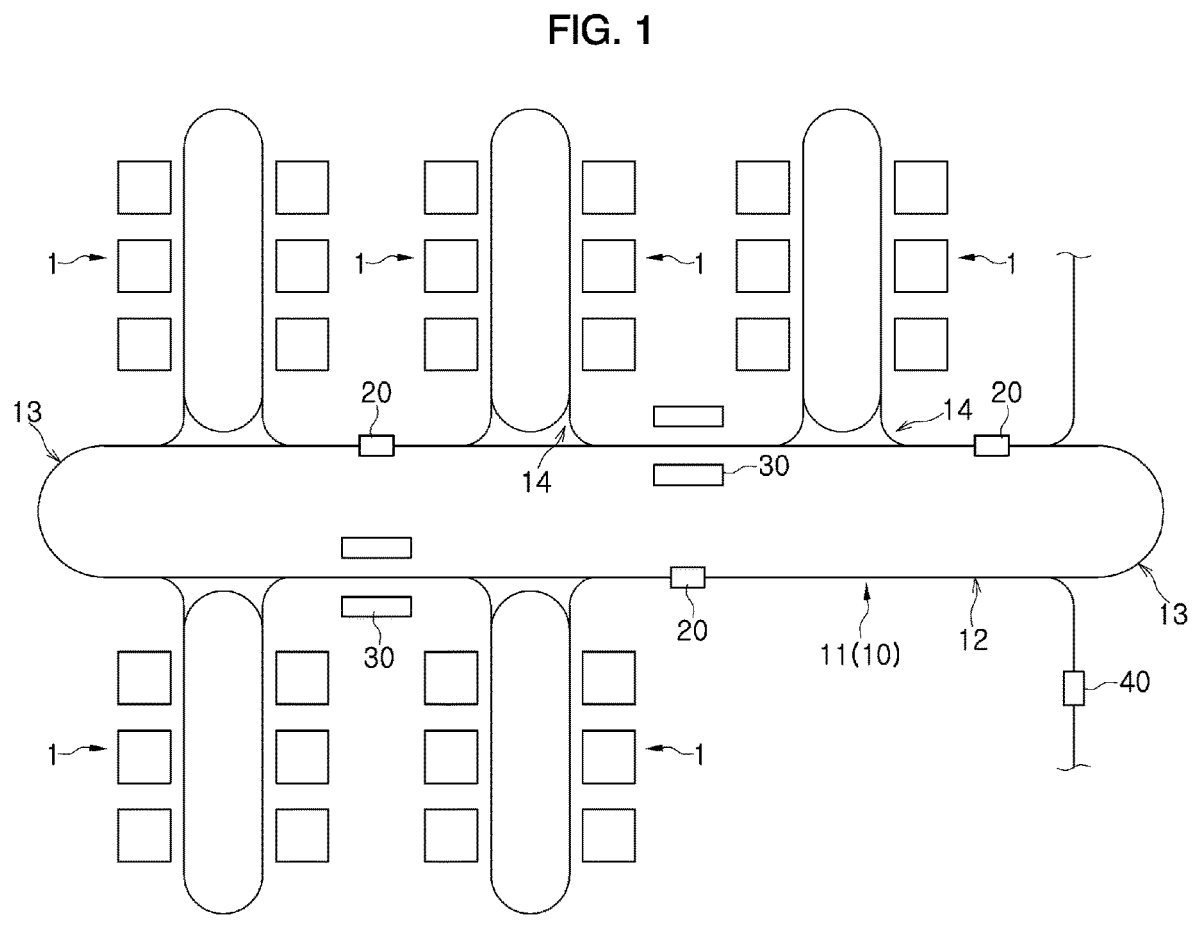

FIG. 1 conceptually illustrating the overall configuration of article transport equipment according to an embodiment of the present disclosure. In FIG. 1, the reference sign of 1 indicates a plurality of semiconductor manufacturing facilities installed in a semiconductor manufacturing plant, and the reference sign of 10 indicates a driving rail that provides a transport path 11 for transporting a FOUP, which is an article, between semiconductor manufacturing facilities 1. The reference sign of 20 indicates a plurality of article transport vehicles that transport articles while each article transport vehicle moves along the transport path 11. The reference sign of 30 indicates a single or a plurality of buffers that provide temporary storage spaces for the articles. The driving rail 10 is disposed on the ceiling of the semiconductor manufacturing plant. The article transport vehicle 20 may transport an article directly from one of the semiconductor manufacturing facilities 1 to another facility, or may temporarily store the article in the buffer 30 and then transport the article to another facility. The buffer 30 may be a rail side buffer installed on the side of the transport path 11 or a lower rail buffer installed under the transport path 11.

The article transport equipment according to the embodiment of the present disclosure includes an OHT. The OHT includes a driving rail 10 and a plurality of article transport vehicles 20. The article transport equipment described above according to the embodiment of the present disclosure is configured so that the article transport vehicles 20 operate by receiving driving power from a power supply unit through a power feeding unit and a power reception unit. In addition, an integrated control device may be further provided to automatically operate the article transport vehicles 20. Although not illustrated, the article transport equipment may further include facilities such as maintenance lifters, driving module lifters, and test benches, for the maintenance and repair of the article transport vehicle 20.

With reference to FIG. 1, the transport path 11 may include at least one or more straight sections 12 in a straight line shape, at least one or more curved sections 13 in a curved shape, and at least one or more connection sections 14 for branching and/or joining the path.

Figure 3:
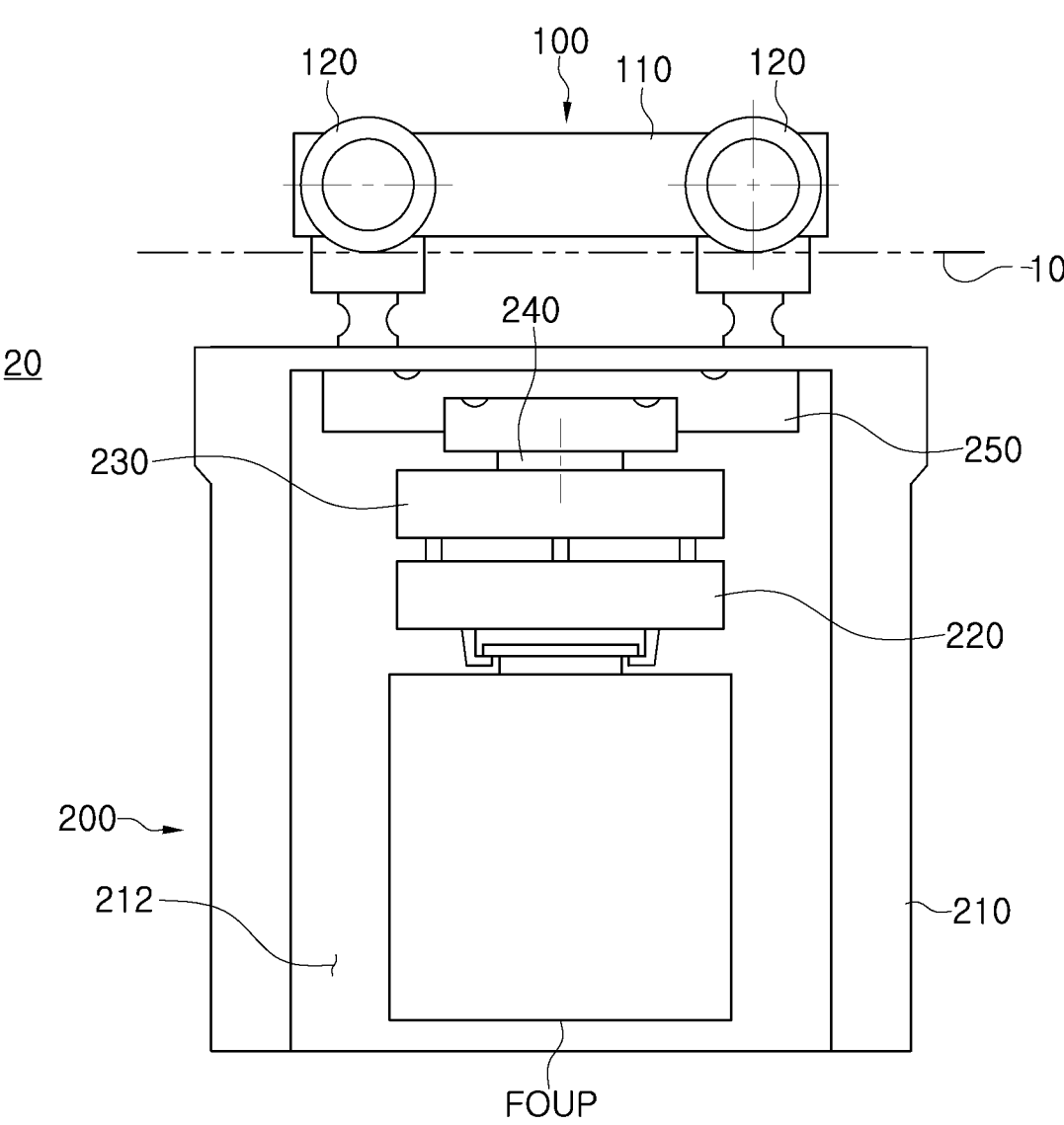

FIGS. 2 and 3 are schematic views for explaining the configuration of the OHT.

With reference to FIG. 2, the driving rail 10 includes a pair of rail members that are spaced and paired with each other in the right and left directions. The driving rail 10 is installed on the ceiling of the semiconductor manufacturing plant by rail supports 15. The lower part of each rail support 15 may support a pair of rail members, and the upper part may be fixed to the ceiling of the semiconductor manufacturing plant. The pair of rail members may be formed to provide a driving surface on the upper side.

With reference to FIG. 2 and FIG. 3, each article transport vehicle 20 includes a driving module 100 that drives along the driving rail 10, and a hoist module 200 that supports a FOUP, which is an article, under the driving module 100. The hoist module 200 is moved with the driving module 100 and supports the article.

The driving module 100 includes a vehicle body 110 and wheels 120. The vehicle body 110 is equipped with axles extending in the right and left directions. A plurality of axles is provided and be spaced from each other in the forward and backward directions. The wheels 120 are driving wheels that impart mobility to the vehicle body 110 so that the vehicle body 110 can drive in accordance with the guidance of the driving rail 10. The wheels 120 are mounted on both ends of the axle, and may touch the respective driving surfaces of a pair of rails 10 to perform rolling. The driving module 100 further includes a wheel drive unit 130 that provides power to rotate the wheels 120. For example, the wheel drive unit 130 may be configured to rotate the axle.

The hoist module 200 includes a frame 210. The frame 210 is connected with the driving module 100 below the driving rail 10. The upper part of the frame 210 may be connected to the lower part of the vehicle body 110 by a single or a plurality of connectors. The frame 210 forms the appearance of the hoist module 200 and provides a storage space 212 in which articles are stored. The frame 210 is formed to have a structure in the left and right sides and the bottom side are open so that the article is movable in the left and right direction and the downward direction, in the storage space 212.

Furthermore, the hoist module 200 further includes a hand unit 220 for gripping or releasing an article, and a hand movement unit that moves the hand unit 220 between a first position and a second position. The first position is a position at which the article gripped by the hand unit 220 is stored in the storage space 212 of the frame 210, and the second position is a position outside the frame 210, that corresponds to a position deviating from the first position. The hoist module 200 includes an up-down drive unit 230, a rotational drive unit 240, and a horizontal drive unit 250 as the hand movement unit.

The hand unit 220 may include a hand that performs gripping and releasing of an article, and a hand support that supports the hand. The up-down drive unit 230 moves the hand unit 220 in the upward and downward directions. The up-down drive unit 230 can move the hand unit 220 in the upward and downward directions by winding or unwinding at least one belt around a drum. The rotational drive unit 240 rotates the hand unit 220 around an axis in the upward and downward directions, and the horizontal drive unit 250 moves the hand unit 220 in the right and left directions. For example, the hand unit 220 is moved up and down by the up-down drive unit 230, the up-down drive unit 230 is rotated around a vertical axis by the rotational drive unit 240, and the rotational drive unit 240 is moved in the left or right direction by the horizontal drive unit 250. In this manner, an article gripped by the hand unit 220 can be moved in the upward and downward directions, rotated around the vertical axis, and moved in the right and left directions.

Figure 4:
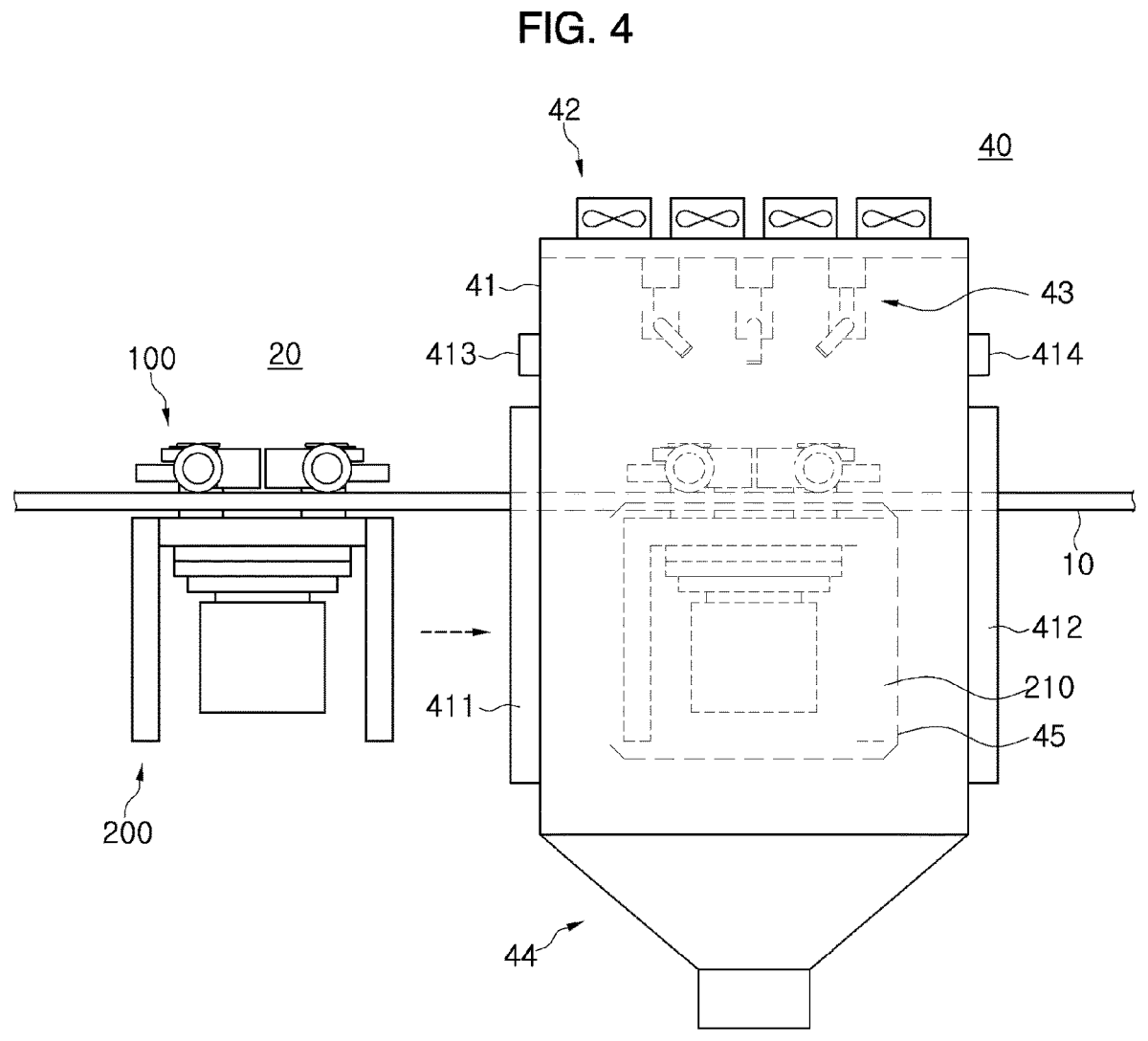
Figure 5:
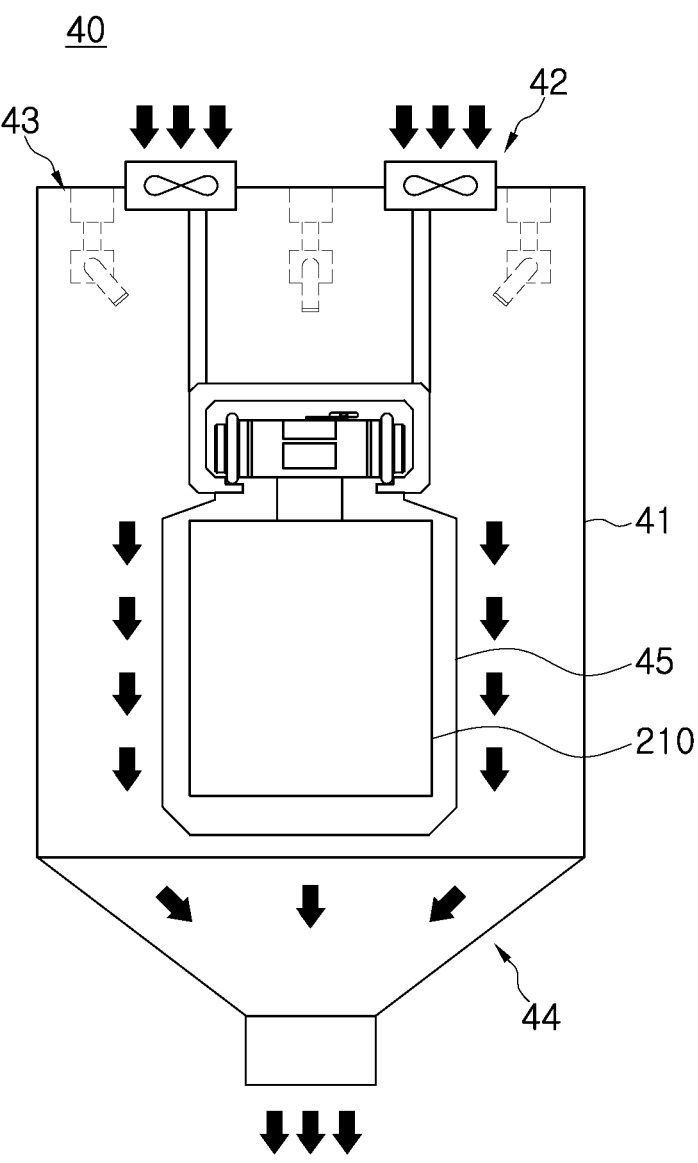

FIGS. 4 and 5 are schematic diagrams and enlarged schematic views for explaining a transport vehicle cleaning device 40 according to the embodiment of the present disclosure. For the convenience of description, some components of the transport vehicle 20 are schematically illustrated.

With reference to FIGS. 4 and 5, the transport vehicle cleaning device 40 according to the embodiment of the present disclosure is disposed to be adjacent to the driving rail 10 and may be used to clean the transport vehicle 20 described above.

The transport vehicle cleaning device 40 may include a housing 41, a fan unit 42, a gas injection unit 43 (i.e., a cleaning gas injector), an exhaust unit 44, and a frame cover 45.

The housing 41 can provide a cleaning space in which cleaning of the transport vehicle 20 is performed. The housing 41 may be fixed to the ceiling of the clean room and disposed to wrap the driving rail 10 and the movement path of the transport vehicle 20. In other words, the housing 41 may be configured so that the transport vehicle 20 that moves along the driving rail 10 can enter and exit for cleaning. The housing 41 includes an entrance for the transport vehicle 20 to enter and an exit for the transport vehicle 20 to exit, and an entrance door 411 for opening and closing the entrance and an exit door 412 for opening and closing the exit are installed.

The transport vehicle 20 that moves along the driving rail 10 enters into the housing 41 after the entrance door 411 is opened. When the entrance of the transport vehicle 20 is completed, the entrance door 411 is closed. When the transport vehicle 20 stops at a predetermined position in the cleaning space, a cleaning process for the transport vehicle is performed. When the cleaning process for the transport vehicle 20 is completed, the transport vehicle 20 resumes driving, and moves to the outside of the housing 41 after the exit door 412 is opened. The exit door 412 is closed when the exit of the transport vehicle 20 to the outside is completed.

A first sensor 413 that detects the entrance of the transport vehicle 20 may be provided at the entrance door 411, and a second sensor 414 that detects the exit of the transport vehicle 20 may be provided at the exit door 412. The first sensor 413 can detect that the transport vehicle 20 approaches the transport vehicle cleaning device 40. The second sensor 414 can detect that the exit of the transport vehicle 20 from the transport vehicle cleaning device 40 has completed. The entrance door 411 may open the entrance door 411 by receiving a detection signal of the transport vehicle 20 from the first sensor 413. The exit door 412 may close the exit door 412 by receiving the detection signal of the transport vehicle 20 from the second sensor 414. Although not illustrated in detail, separate actuators may be provided for opening and closing the entrance door 411 and the exit door 412.

The opening times of the entrance door 411 and the exit door 412 may be set in advance. The opening time of the door may be set based on the transport speed of the transport vehicle 20. The exit door 412 may be set to open after a predetermined period of time after the entrance door 411 is closed. Here, the predetermined time may be time required for the cleaning process to be performed immediately after closing the entrance door 411, and may be set by a device user. At this time, the starting point, which is the reference point for the required time, may also be set by the device user. For example, the starting point of the required time may be immediately after the entrance door 411 is opened. Alternatively, the starting point of the required time may be a time point when the first sensor 413 detects the transport vehicle 20.

The fan unit 42 may be provided at the upper part of the housing 41 to form a downward airflow in the cleaning space. The fan unit 42 may include a plurality of fans that supply a downward airflow to the cleaning space. The fan unit 42 can bring air into the housing 41 by the operation of the fans. The plurality of fans may include a wing wheel that causes the flow of air and a casing for guiding the flow of air entering the wing wheel. The wing wheel may be a cylinder that rotates with multiple wings arranged at equal intervals on the circumference. The fan unit 42 may further include a filter that removes contaminants that may enter with the air. As an example, the filter may include a high efficiency particulate air (HEPA) filter or an ultra-low penetration air (ULPA) filter. The filter may be provided at the upper part or lower part of each fan. Alternatively, the filter may be provided both at the upper part and the lower part of each fan. The fan unit 42 may maintain a downward airflow in the cleaning space by operating normally.

The gas injection unit 43 is provided on the ceiling of the housing 41 and can inject a cleaning gas towards the transport vehicle 20. The gas injection unit 43 may include a plurality of nozzles. Alternatively, the gas injection unit 43 may have an air knife shape. The gas injection time and the gas injection amount of the gas injection unit 43 may be set in advance and adjusted. The gas injection unit 43 may be provided in an area in which the transport vehicle 20 that has entered into the housing 41 stops.

As an example, in the gas injection unit 43, gas flow paths arranged in a plurality of rows in a disposition direction of the driving rail 10 are provided on the ceiling in the housing 41, and a plurality of nozzles may be arranged at regular intervals in each gas flow path. At this time, the plurality of nozzles may be arranged to face the driving module 100, which is the upper area of the transport vehicle 20, and to inject the gas onto the entire surface of the driving module 100 as much as possible. For example, the plurality of nozzles may be arranged in a zigzag manner.

As an example, in the gas injection unit 43, a plurality of air knives that form long in the disposition direction of the driving rail 10 may be provided on the ceiling of the housing 41. At this time, the gas injection direction of each air knife may be arranged to face the driving module 100, which is the upper area of the transport vehicle 20.

The gas injected by the gas injection unit 43 may be clean dry air (CDA).

Although not illustrated in detail, the gas injection unit 43 can be installed to be raised and lowered from the ceiling of the housing 41 to improve cleaning efficiency.

The exhaust unit 44 is provided at the lower part of the housing 41 and can exhaust the cleaning space. Although not illustrated in detail, the exhaust unit 44 includes an exhaust port 44-1, an exhaust pipe 44-2, and a vacuum pump 44-3. The exhaust pipe 44-2 may connect the exhaust port 44-1 to the pump. In an embodiment, the exhaust port 44-1 may have a funnel shape having a decreasing width toward an end of the exhaust port 44-1 or where the exhaust port 44-1 is connected to the exhaust pipe 44-2. The exhaust unit 44 may be provided at the bottom surface of the housing 41. The downward airflow formed in the housing 41, the gas supplied from the gas injection unit 43, and foreign matters removed from the transport vehicle 20 can be sucked and removed by the exhaust unit 44. The exhaust unit 44 may be operated from the time when the transport vehicle 20 entering the transport vehicle cleaning device 40 has completed until the transport vehicle 20 exiting from the transport vehicle cleaning device 40 has completed. By the powerful downward airflow formed when the fan unit 42 and the exhaust unit 44 that operate normally are simultaneously operated, foreign matters such as particles removed from the transport vehicle 20 are removed directly through the exhaust unit 44, thereby preventing foreign matters such as particles from being scattered.

The frame cover 45 is provided in the housing 41 and can prevent an occurrence of a situation in which particles scattered from the driving module 100 adhere to the frame 210 of the hoist module 200. The frame cover 45 may be configured to cover the open surface of the frame 210. The frame cover 45 can block the internal space of the frame 210 from the internal space of the housing 41 by sealing the open surface of the frame 210. In other words, the frame cover 45 can block the internal space of the frame 210 from the cleaning space. The size of the frame cover 45 may be formed to be finely larger than the size of the frame 210. Specifically, the frame cover 45 may be provided so that the size of the frame cover 45 is the minimum size where the frame 210 does not touch the inner side wall of the frame cover 45 when the transport vehicle 20 completely enters into the frame cover 45. In an embodiment, the frame cover 45 may be fixedly connected to an inside of the housing 41 at a predetermined position and the frame 210 is moved to be engaged with the frame cover 45 and the frame cover 45 may cover the open surface of the frame 210.

The transport vehicle 20 that enters into the housing 41 can stop at a predetermined position in the housing 41, and the position where the transport vehicle 20 stops is a position where the frame cover 45 can completely seal the open surface of the frame 210. In other words, the transport vehicle 20 can stop at the position set in advance after completely entering into the frame cover 45.

The frame cover 45 can prevent the occurrence of a situation in which foreign matters such as particles separated from the driving module 100 by the gas injection unit 43 adhere to the hoist module 200 again.

In the present disclosure, the example in which the frame cover 45 covers only the open area of the frame 210 has been described, but the frame cover 45 may be designed to cover the entire surface of the frame 210.

Figure 6:
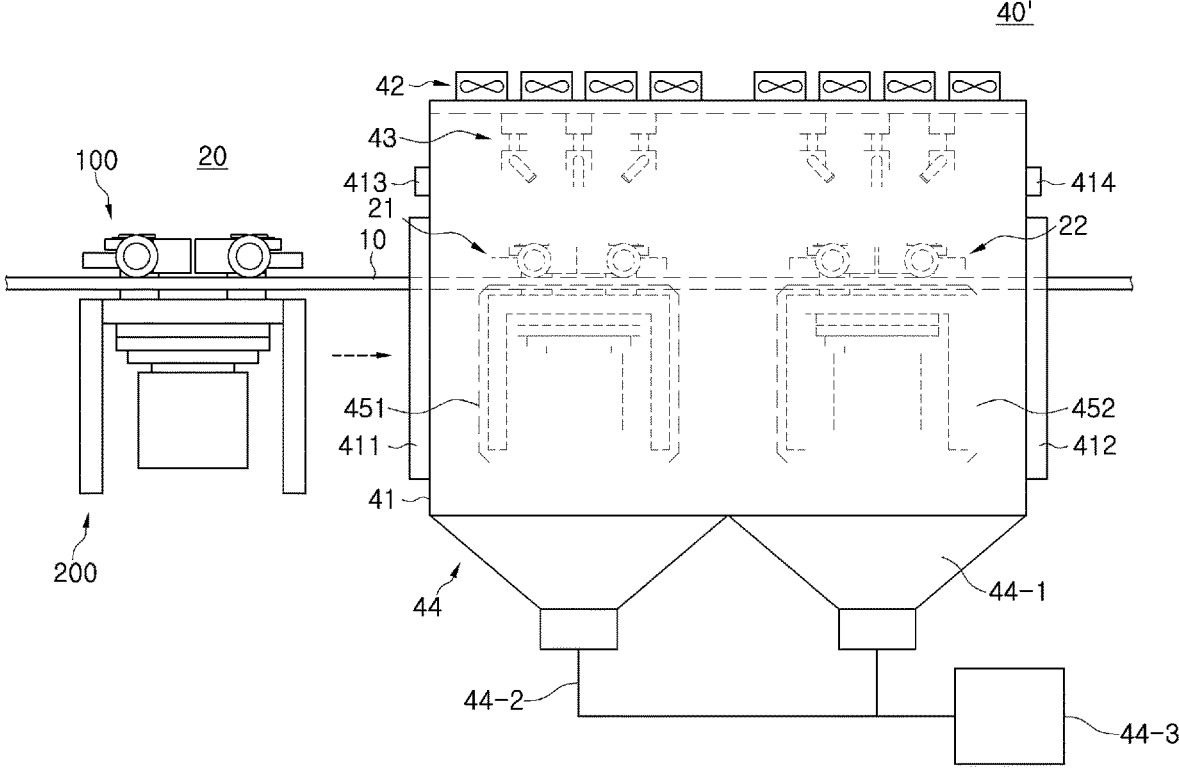
FIGS. 6 and 7 are a left side view and a perspective view illustrating a modification example of the transport vehicle cleaning device illustrated in FIGS. 4 and 5.
Figure 7:
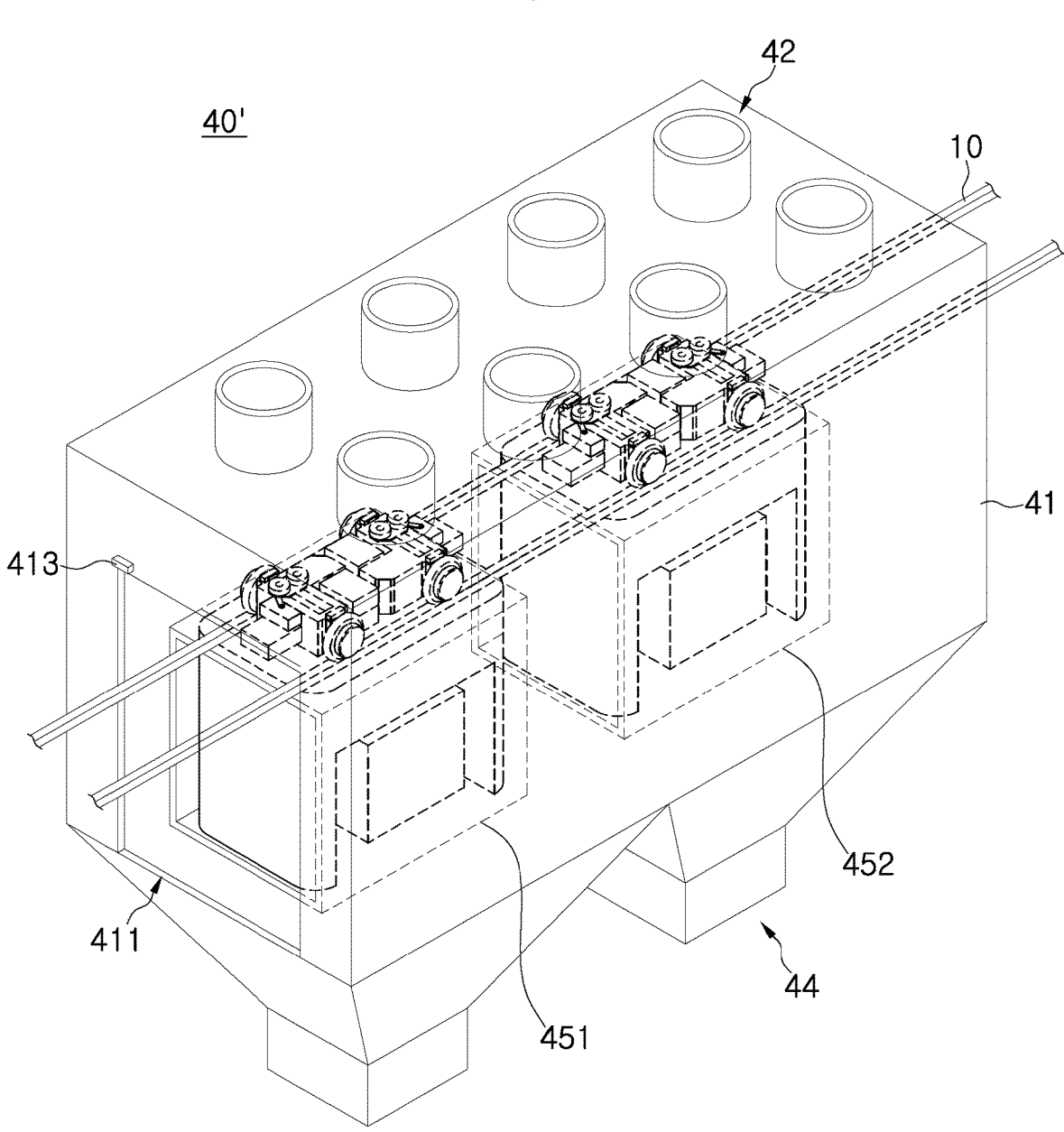

FIGS. 6 and 7 illustrate a modification example of the transport vehicle cleaning device illustrated in FIGS. 4 and 5. FIG. 6 illustrates a side view of the transport vehicle cleaning device according to the modification example, and FIG. 7 schematically illustrates a view of the transport vehicle cleaning device in FIG. 6. Some components have been omitted or distorted for the convenience of description.

The difference between a transport vehicle cleaning device 40' illustrated in FIGS. 6 and 7 and the transport vehicle cleaning device 40 illustrated in FIGS. 4 and 5 is the number of transport vehicles 20 that can be stored. In other words, the transport vehicle cleaning device 40' can be configured to simultaneously clean a plurality of transport vehicles 20. For example, the transport vehicle cleaning device 40' can be configured to simultaneously clean two transport vehicles 21, 22. Except for this point, the other components are the same as the transport vehicle cleaning device 40, and thus the repetitive description will be omitted.

The transport vehicle cleaning device 40' may look like a form in which two transport vehicle cleaning devices 40 described above are connected to each other. The transport vehicle cleaning device 40' may include a first frame cover 451 and a second frame cover 452. The transport vehicle cleaning device 40' cleans two transport vehicles 21, 22 at once, and thus it is possible to improve process efficiency.

Meanwhile, FIGS. 6 and 7 illustrate the example in which the exhaust unit of the transport vehicle cleaning device 40' has two exhaust ports, but the exhaust unit may be provided in the form in which the two exhaust ports are combined into one exhaust port.

The number of transport vehicles that can be stored in the transport vehicle cleaning device may be adjusted, and the transport vehicle cleaning device may be designed in this form.

Figure 8:
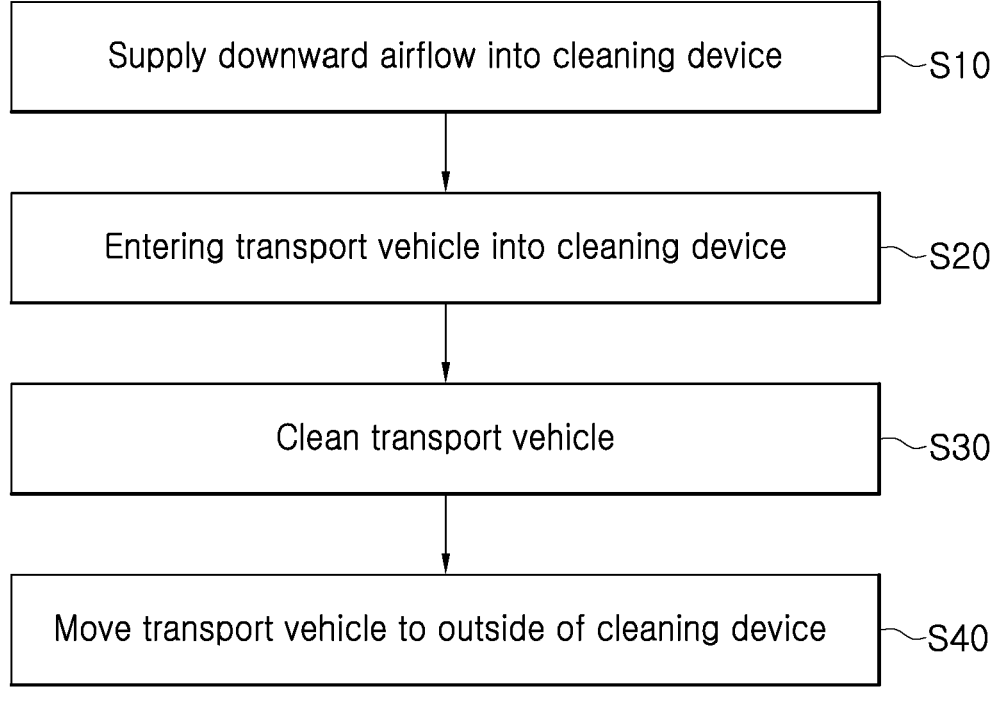
FIGS. 8 and 9 are flowcharts for explaining a method of cleaning an article transport vehicle according to an embodiment of the present disclosure.
Figure 9:
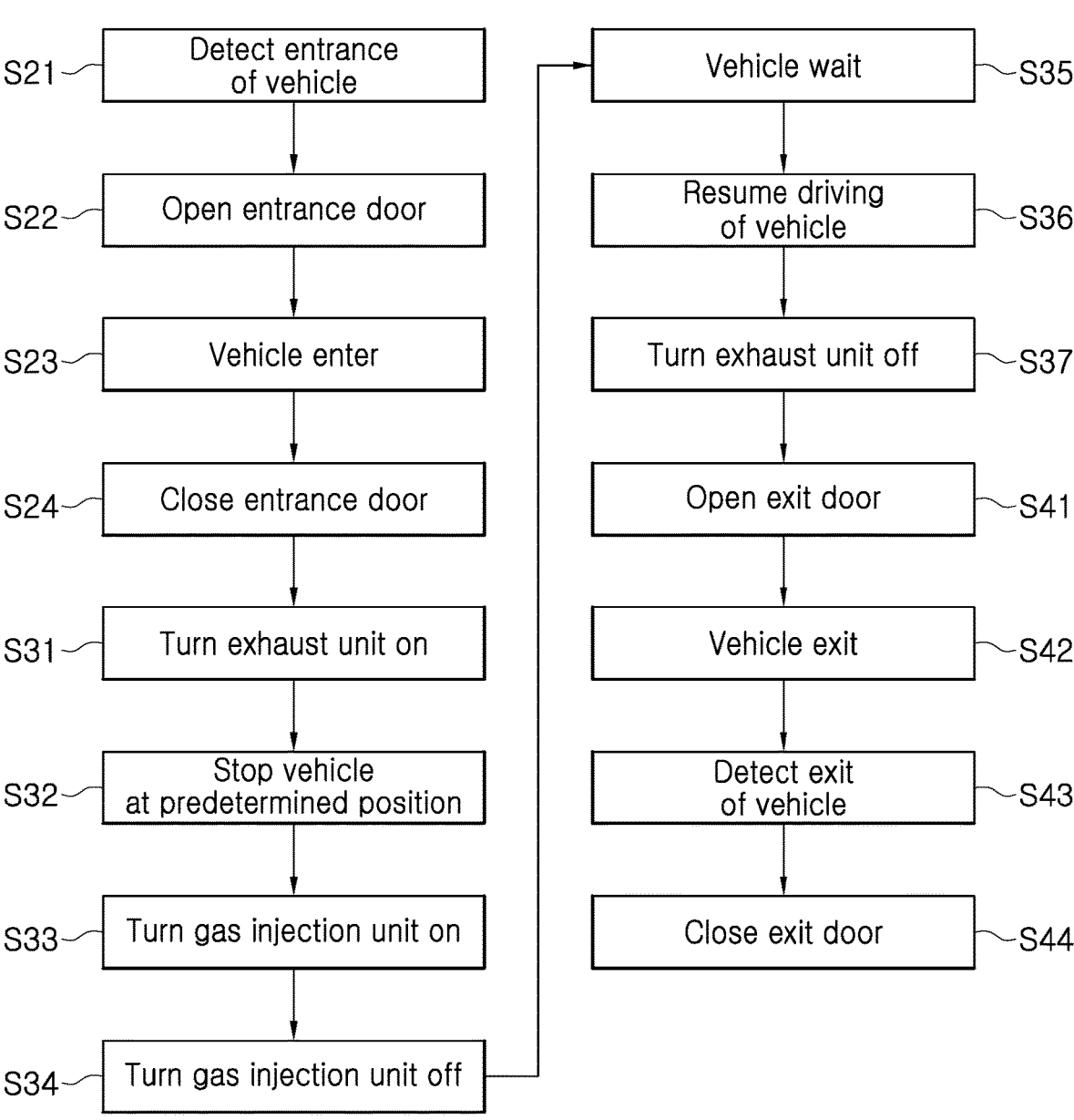

FIGS. 8 and 9 are flowcharts illustrating a transport vehicle cleaning method according to an embodiment of the present disclosure. The transport vehicle cleaning method according to the embodiment of the present disclosure can be performed by the transport vehicle cleaning device described above.

With reference to FIG. 8, the transport vehicle cleaning method according to the embodiment of the present disclosure may include a step of supplying a downward airflow into the transport vehicle cleaning device (S10), a step of entering the transport vehicle into the transport vehicle cleaning device (S20), a step of cleaning the transport vehicle (S30), and a step of moving the transport vehicle to the outside of the transport vehicle cleaning device (S40).

The step of supplying the downward airflow into the cleaning device (S10) is a step of supplying a downward airflow into the cleaning space and may be performed by the fan unit 42 provided at the upper part of the cleaning device 40. The step S10 is a step that is maintained throughout the entire process of the transport vehicle cleaning method according to the embodiment of the present disclosure. In other words, the step S10 is performed continuously (normally) throughout the entire stage of the transport vehicle cleaning method.

The step of entering the transport vehicle into the cleaning device (S20) may include a vehicle entrance detection step (S21), an entrance door opening step (S22), a vehicle entrance step (S23), and an entrance door closing step (S24).

The vehicle entrance detection step (S21) is a step of detecting that the transport vehicle 20 approaches the transport vehicle cleaning device 40 to enter into the transport vehicle cleaning device 40.

The entrance door opening step (S22) is a step of opening the entrance door of the transport vehicle cleaning device 40.

The vehicle entrance step (S23) is a step in which the transport vehicle 20 enters into the cleaning space of the transport vehicle cleaning device 40.

The entrance door closing step (S24) is a step of closing the entrance door of the transport vehicle cleaning device 40 when the transport vehicle 20 has completely entered into the cleaning space.

The time for which the entrance door is kept open may be adjusted based on the transport speed of the transport vehicle 20.

The step of cleaning the transport vehicle (S30) starts from when the entrance door is closed, and may include an exhaust unit ON step (S31), a vehicle predetermined-position stop step (S32), a gas injection unit ON step (S33), a gas injection unit OFF step (S34), a vehicle waiting step (S35), a vehicle resumption step (S36), and an exhaust unit OFF step (S37).

The exhaust unit ON step (S31) is a step of turning ON the exhaust unit 44 to start exhausting of the cleaning space. According to the exhaust unit ON step (S31), the exhaust unit 44 and the fan unit 42 are simultaneously operated from when the entrance of the transport vehicle 20 into the cleaning space has completed, so that a downward airflow can be formed in the cleaning space.

The vehicle predetermined-position stop step (S32) is a step of stopping the transport vehicle 20 at a predetermined position. In the vehicle positional stopping step (S32), the transport vehicle 20 is located in the frame cover. Thus, the inside of the frame can be blocked from the cleaning space. As a result, the hoist module 200, which is in the lower area of the transport vehicle 20, can be protected from foreign matters such as particles scattered from the driving module 100.

The gas injection unit ON step (S33) is a step of performing gas injection towards the transport vehicle 20 by operating the gas injection unit. Since the gas injection unit injects the gas toward the surface of the driving module 100 of the transport vehicle 20, it is possible to remove foreign matters such as particles adhering to the driving module 100.

The gas injection unit OFF step (S34) of stopping the operation of the gas injection unit may be performed after gas injection has been performed for a predetermined period of time.

The vehicle waiting step (S35) is a step of causing the vehicle to wait until foreign matters in the cleaning space are completely removed by the exhaust unit 44 after the operation of the gas injection unit is stopped.

The vehicle driving resumption step (S36) is a step performed when foreign matters in the cleaning space are completely removed, and is a step of driving the stopped transport vehicle again.

The exhaust unit OFF step (S37) is a step of turning OFF the exhaust unit 44 that continuously operates during the transport vehicle cleaning step (S30).

The step of moving the transport vehicle to the outside of the transport vehicle cleaning device (S40) is a step of moving the transport vehicle that has completed the cleaning process to the outside of the transport vehicle cleaning device. The step of moving the transport vehicle to the outside of the transport vehicle cleaning device (S40) may include an exit door opening step (S41), a vehicle exit step (S42), a vehicle exit detection step (S43), and an exit door closing step (S44).

The exit door opening step (S41) is a step of opening the exit door of the transport vehicle cleaning device 40 in order to cause the transport vehicle 20 that has completed the cleaning process to exit to the outside of the transport vehicle cleaning device.

The vehicle exit step (S42) is a step in which the transport vehicle 20 exits to the outside of the transport vehicle cleaning device 40 through the opened exit door of the transport vehicle cleaning device 40.

The vehicle exit detection step (S43) detects that the exit process of the transport vehicle 20 has been completed. It is possible to detect that the transport vehicle 20 has completely exited from the transport vehicle cleaning device 40.

The exit door closing step (S44) is a step of closing the exit door of the transport vehicle cleaning device, which has been opened. The time for which the exit door is kept open may be adjusted based on the transport speed of the transport vehicle 20.

According to the embodiment of the present disclosure, cleaning of the transport vehicle 20 may be performed for each cycle, and the cleaning cycle may be set. In addition, the detailed operation (cleaning time, door opening time, operating time point and time of each component, and the like) of the transport vehicle cleaning device 40 for cleaning the transport vehicle 20 may be set or adjusted by the user.

Also, according to the embodiment of the present disclosure as described above, cleaning of the transport vehicle 20 may be performed by the transport vehicle cleaning device 40 disposed to be adjacent to the driving rail 10. Thus, it is possible to greatly reduce the time required for cleaning as compared with the case of conventional technique using a separate lift. In particular, since cleaning of the transport vehicle 20 may be performed in the housing 41 that provides the cleaning space, and the frame cover 45 for protecting the hoist module 200 is provided in the housing 41, it is possible to prevent the occurrence of a situation in which foreign matters such as particles scattered from the driving module 100 at the upper part adhere again to the hoist module 200 at the lower part. Also, it is possible to suppress scattering of foreign matters such as particles by forming a downward airflow in the cleaning space by the fan unit 42 and the exhaust unit 44 provided at the upper part of the housing 41.

Although the above description of the present disclosure has been provided for illustrative purposes, those skilled in the art will appreciate that various modifications, additions, and substitutions are possible, without departing from essential characteristics of the disclosure. Therefore, the embodiments of the present disclosure are not intended to limit the technical spirit of the disclosure but rather to describe the technical spirit of the disclosure, and the scope of the technical spirit of the disclosure is not to be limited by the above embodiments. The protection scope of the present invention should be construed by the following claims, and all technical ideas within the scope equivalent thereto should be construed as being included in the scope of the present invention.

What is claimed is:

1. A transport vehicle cleaning device that cleans a transport vehicle transporting an article along a driving rail and including a driving module and a frame connected to a lower part of the driving module and having a storage space for the article, the transport vehicle cleaning device comprising:

a housing wrapping the driving rail and a movement path of the transport vehicle and including a cleaning space accommodating the transport vehicle for cleaning;

a plurality of fans disposed at an upper part of the housing and generating a downward airflow in the cleaning space;

a cleaning gas injector disposed at a ceiling of the housing and injecting a cleaning gas towards the transport vehicle in the cleaning space of the housing;

an exhaust unit provided at a lower part of the housing and exhausting the cleaning gas supplied to the cleaning space and a foreign matter removed from the transport vehicle from the cleaning space; and a frame cover disposed in the housing and configured to completely cover opposite openings of the frame in the housing to form a closed internal space of the frame separated from the cleaning space, thereby preventing particles scattered by the cleaning gas from the upper part of the transport vehicle from adhering to the lower part of the transport vehicle.

2. The transport vehicle cleaning device according to claim 1, wherein the frame cover is configured to entirely wrap the frame to form the closed internal space separated from the cleaning space.

3. The transport vehicle cleaning device according to claim 2, wherein the transport vehicle is controlled such that the frame cover and the frame are engaged with each other to form the closed internal space of the frame.

4. The transport vehicle cleaning device according to claim 1, wherein the housing includes an entrance door for receiving the transport vehicle into the housing and an exit door for releasing the transport vehicle from the housing.

5. The transport vehicle cleaning device according to claim 4, further comprising:

a first sensor detecting the transport vehicle approaching the entrance door; and a second sensor detecting the transport vehicle moving away from the exit door.

6. The transport vehicle cleaning device according to claim 1, wherein the cleaning gas injector includes a plurality of nozzles.

7. The transport vehicle cleaning device according to claim 6, wherein each nozzle of the plurality of nozzles injects the cleaning gas toward a surface of the driving module accommodated in the housing.

8. The transport vehicle cleaning device according to claim 1, wherein the cleaning gas includes an inert gas or dry clean air.

9. The transport vehicle cleaning device according to claim 1, wherein the driving rail continuously extends through the cleaning space of the housing.

* * * * *